United States Patent
Yan

(10) Patent No.: US 12,513,897 B2
(45) Date of Patent: Dec. 30, 2025

(54) SEMICONDUCTOR STRUCTURE HAVING VOID IN A BIT LINE CONTACT STRUCTURE

(71) Applicant: CHANGXIN MEMORY TECHNOLOGIES, INC., Hefei (CN)

(72) Inventor: Xun Yan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 376 days.

(21) Appl. No.: 18/327,224

(22) Filed: Jun. 1, 2023

(65) Prior Publication Data

US 2023/0328969 A1  Oct. 12, 2023

Related U.S. Application Data

(63) Continuation of application No. PCT/CN2022/136886, filed on Dec. 6, 2022.

(30) Foreign Application Priority Data

Jan. 17, 2022  (CN) .......................... 202210051482.8

(51) Int. Cl.
  *H10B 12/00* (2023.01)
(52) U.S. Cl.
  CPC ........... *H10B 12/485* (2023.02); *H10B 12/02* (2023.02); *H10B 12/482* (2023.02)
(58) Field of Classification Search
  CPC .... H10B 12/02; H10B 12/482; H10B 12/485; H10D 84/0126; H10D 84/0386
  See application file for complete search history.

(56) References Cited

U.S. PATENT DOCUMENTS

| 11,164,877 B2 | 11/2021 | He et al. |
| 11,877,443 B2 * | 1/2024 | Ma .......................... H10B 12/37 |
| 2016/0163637 A1 | 6/2016 | Jung et al. |

FOREIGN PATENT DOCUMENTS

| CN | 109003938 A | 12/2018 |
| CN | 110556359 A | 12/2019 |
| CN | 110690193 A | 1/2020 |
| CN | 111640746 A | 9/2020 |
| CN | 113314469 A | 8/2021 |

OTHER PUBLICATIONS

International Search Report cited in PCT/CN2022/136886 mailed Feb. 8, 2023, 7 pages.

* cited by examiner

*Primary Examiner* — Hoai V Pham
(74) *Attorney, Agent, or Firm* — Syncoda LLC; Feng Ma

(57) ABSTRACT

The present disclosure provides a method of preparing a semiconductor structure and a semiconductor structure, which relate to the field of semiconductors. The method includes: setting a top surface of a second conductive layer to be lower than a top surface of a first conductive layer; setting a top surface of a first initial bit line conductive layer to be higher than a top surface of a second initial bit line conductive layer; etching the first initial bit line conductive layer by a first etching process, and performing the first etching process on a part of the second initial bit line conductive layer; etching the first conductive layer by a second etching process, and etching a remaining part of the second initial bit line conductive layer; and forming a bit line contact structure wrapping a void, widths of parts of the bit line contact structure gradually increasing.

11 Claims, 6 Drawing Sheets

SEMICONDUCTOR STRUCTURE HAVING VOID IN A BIT LINE CONTACT STRUCTURE

CROSS-REFERENCE TO RELATED APPLICATIONS

This is a continuation of International Application No. PCT/CN2022/136886, filed on Dec. 6, 2022, which claims the priority to Chinese Patent Application 202210051482.8, titled "METHOD OF PREPARING SEMICONDUCTOR STRUCTURE AND SEMICONDUCTOR STRUCTURE" and filed on Jan. 17, 2022. The entire contents of International Application No. PCT/CN2022/136886 and Chinese Patent Application 202210051482.8 are incorporated herein by reference.

TECHNICAL FIELD

Embodiments of the present disclosure relate to, but are not limited to, a method of preparing a semiconductor structure and a semiconductor structure.

BACKGROUND

With rapid development of integrated circuit technology, the density of devices in an integrated circuit is getting higher and higher, and feature sizes of semiconductor devices are continuously reduced. In the manufacturing process, to lead out a source/drain signal, a capacitor contact structure and a bit line contact structure are usually prepared in a semiconductor structure.

The capacitor contact structure is connected to one of a source and a drain in the semiconductor structure, such that a capacitor is electrically connected to the source/drain, and the bit line contact structure is connected to the other one of the source and the drain in the semiconductor structure, such that a bit line is electrically connected to the source/drain. In this way, the bit line may be configured to read data information stored in the capacitor or write the data information into the capacitor to ensure normal operation of the semiconductor devices.

However, there may be a problem of short circuit in the semiconductor structure when the current process is used to prepare the semiconductor structure.

SUMMARY

An overview of the subject matter detailed in the present disclosure is provided below, which is not intended to limit the protection scope of the claims.

Embodiments of the present disclosure provide a method of preparing a semiconductor structure and a semiconductor structure.

According to a first aspect of the present disclosure, the embodiments of the present disclosure provide a method of preparing a semiconductor structure. The method of preparing a semiconductor structure includes: providing a substrate, the substrate being provided with a recess, and a surface of the substrate exposing an opening of the recess; forming a conductive layer, the conductive layer including a first conductive layer and a second conductive layer, the first conductive layer being located on the surface of the substrate, the second conductive layer being located in the recess, a top surface of the second conductive layer being lower than a top surface of the first conductive layer, and the second conductive layer located in the recess being provided with a void; forming a first initial bit line conductive layer on a side of the first conductive layer distant from the substrate, and forming a second initial bit line conductive layer on a side of the second conductive layer distant from the substrate, a top surface of the first initial bit line conductive layer being higher than a top surface of the second initial bit line conductive layer; etching the first initial bit line conductive layer by a first etching process until the first conductive layer is exposed, to form a first bit line conductive layer, and performing the first etching process on a part of the second initial bit line conductive layer, the second initial bit line conductive layer being not completely etched; etching the first conductive layer by a second etching process, to form a first conductive structure, a width of the first conductive structure remaining unchanged in a direction perpendicular to the substrate, and etching a remaining part of the second initial bit line conductive layer by the second etching process, to form a second bit line conductive layer, and an etching rate of the first etching process for the second initial bit line conductive layer being greater than an etching rate of the second etching process for the second initial bit line conductive layer; and etching the second conductive layer, and forming a bit line contact structure wrapping the void, widths of parts of the bit line contact structure gradually increasing in a direction that a top surface of the bit line contact structure points to a bottom surface of the bit line contact structure.

According to a second aspect of the present disclosure, the embodiments of the present disclosure further provide a semiconductor structure. The semiconductor structure includes: a substrate, provided with a recess, a surface of the substrate exposing an opening of the recess; a bit line contact structure, located in the recess and wrapping a void, widths of parts of the bit line contact structure gradually increasing in a direction that a top surface of the bit line contact structure points to a bottom surface of the bit line contact structure; a first conductive structure, located on the surface of the substrate, a width of the first conductive structure remaining unchanged in a direction perpendicular to the substrate; and a first bit line conductive layer and a second bit line conductive layer, the first bit line conductive layer being located on a side of the first conductive layer distant from the substrate, the second bit line conductive layer being located on a side of the bit line contact structure distant from the substrate, a top surface of the first bit line conductive layer being higher than a top surface of the second bit line conductive layer.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

REFERENCE NUMERALS

200. Substrate; 10. Recess; 11. First initial conductive layer; 12. Second initial conductive layer; 13. First sacrificial layer; 14. First initial bit line conductive layer; 15. Second initial bit line conductive layer; 16. First initial adhesion layer; 17. Second initial adhesion layer; 18. First initial insulating layer; 19. Second initial insulating layer; 20. Void; 210. Conductive layer; 211. First conductive layer; 212. Second conductive layer; 221. First bit line conductive layer; 222. Second bit line conductive layer; 231. First conductive structure; 232. Bit line contact structure; 241. First adhesion layer; 242. Second adhesion layer; 251. First insulating layer; 252. Second insulating layer; 1. First bit line; 2. Second bit line; 260. Bit line protective layer; 261. First bit line protective layer; 262. Second bit line protective layer; 263. Third bit line protective layer; 270. Capacitor contact structure; and 280. Second sacrificial layer.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

It can be seen from the background art that there may be a problem of short circuit in the semiconductor structure when the current process is used to prepare the semiconductor structure.

After analysis, it is found that one of the reasons for the possible short circuit in the semiconductor structure is that: when a bit line contact structure is prepared, it is necessary to first prepare a recess in a substrate and then fill the recess with an initial conductive layer. Since the recess has a large aspect ratio, a void may be formed in the initial conductive layer when the initial conductive layer is formed. Due to the existence of the void, when capacitor contact structures are subsequently formed on both sides of the bit line contact structure, the capacitor contact structures located on both sides of the bit line contact structure may be electrically connected, resulting in a short circuit in the semiconductor structure.

Figure 1:
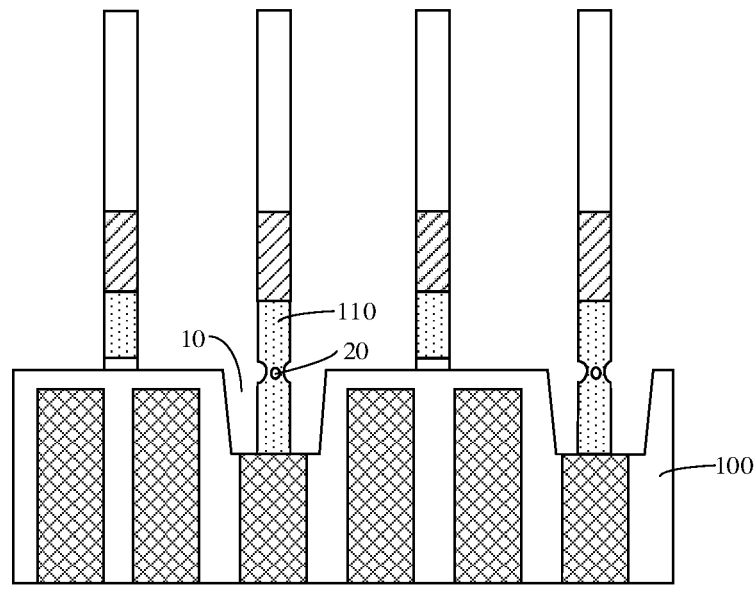
FIG. 1 to FIG. 3 are schematic structural diagrams corresponding to a method of preparing a semiconductor structure.
Figure 2:
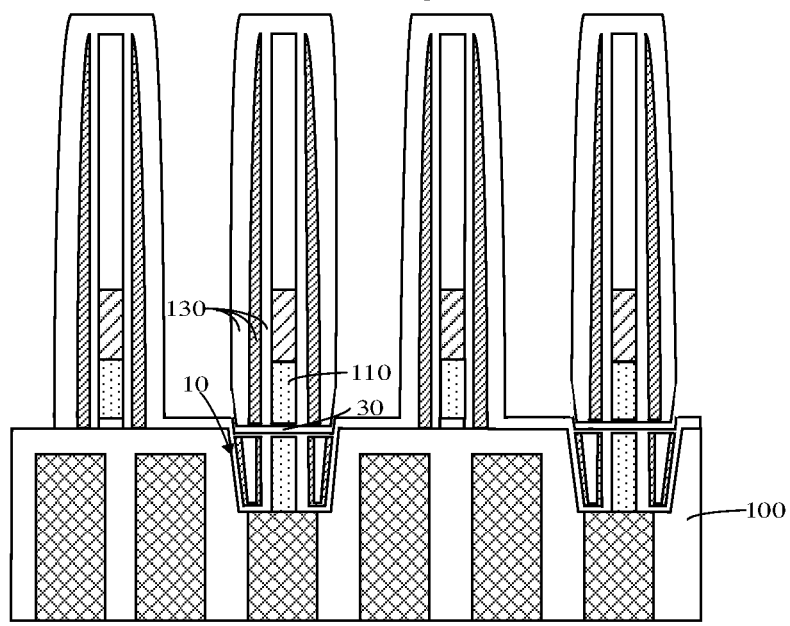
Figure 3:
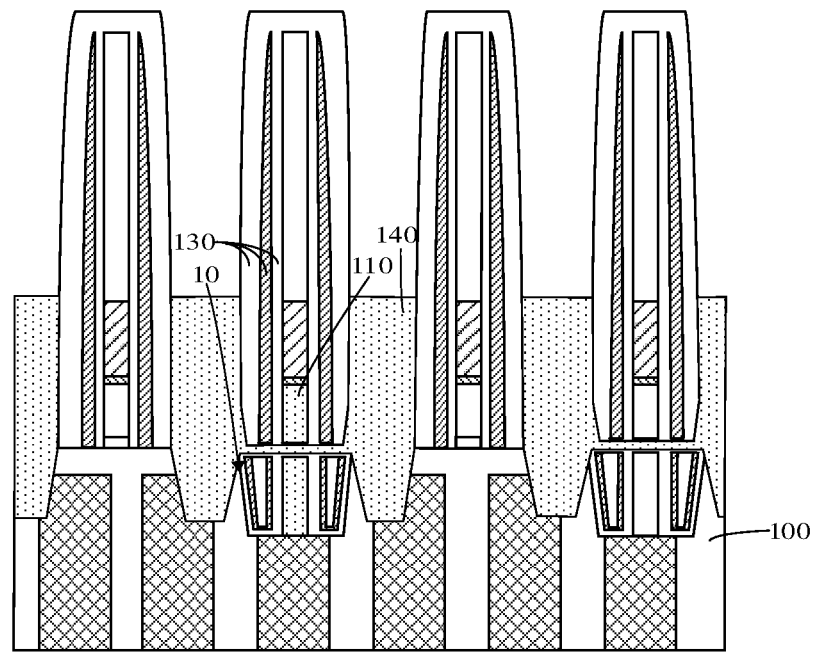

The reasons for the above problem are further analyzed in combination with a method of preparing a semiconductor structure. FIG. 1 to FIG. 3 are schematic structural diagrams corresponding to a method of preparing a semiconductor structure. Referring to FIG. 1, the bit line contact structure 110 is formed in the recess 10 of the substrate 100. Since there is a void 20 in the initial conductive layer (not shown in the figure) in the recess 10, when the initial conductive layer in the recess 10 is etched to form the bit line contact structure 110, the etching rate of an etching process for the initial conductive layer directly facing the void 20 is large, such that the bit line contact structure 110 having a neck-shaped morphology is formed. That is, the side walls of the bit line contact structure 110 directly facing the void 20 are thin. Referring to FIG. 2, a bit line protective layer 130 is formed on both sides of the bit line contact structure 110. Since the side walls of the bit line contact structure 110 directly facing the void 20 are thin, in the process of forming the bit line protective layer 130, process damage may occur to the bit line contact structure 110, resulting in the removal of the side walls of the bit line contact structure 110 directly facing the void 20, such that channel 30 is formed in the bit line contact structure 110. Referring to FIG. 3, the capacitor contact structures 140 are formed on both sides of the bit line contact structure 110. Since the channel is formed in the bit line contact structure 110, when a conductive material is deposited to form the capacitor contact structures 140, the conductive material is also located at the channel 30, and the capacitor contact structures 140 located on both sides of the bit line contact structure 110 may be electrically connected through the channel 30, resulting in a short circuit. In addition, the bit line contact structure 110 may also be electrically connected to the capacitor contact structures 140, resulting in a short circuit in the semiconductor structure.

The embodiments of the present disclosure provide a method of preparing a semiconductor structure. By setting a top surface of a first conductive layer to be higher than a top surface of a second conductive layer, and setting a top surface of a first initial bit line conductive layer to be higher than a top surface of a second initial bit line conductive layer, when a first initial bit line and a second initial bit line are etched by a first etching process, the first initial bit line conductive layer is completely etched first, and the second initial bit line conductive layer is not completely etched. Therefore, when the first conductive layer is etched by a second etching process, it is also required to continuously etch the second initial bit line conductive layer by the second etching process. Since the second etching process is a process designed on the basis of the first conductive layer, the etching rate of the second etching process for the second initial bit line conductive layer is slow. Therefore, in a formed second bit line conductive layer, the widths of parts of the second bit line conductive layer facing the second conductive layer gradually increase in a direction of the second bit line conductive layer pointing to the second conductive layer. When the second conductive layer is etched subsequently, the morphology of the second conductive layer is continued, such that in a direction that a top surface of the bit line contact structure points to a bottom surface of the bit line contact structure, the widths of parts of the bit line contact structure gradually increase. That is, the thicknesses of parts of the side walls of the bit line contact structure directly facing the void gradually increase, such that after the capacitor contact structures are subsequently formed on both sides of the bit line contact structure, the side walls of the bit line contact structure directly facing the void are not penetrated, thereby reducing the possibility of a short circuit in the semiconductor structure.

FIG. 4 to FIG. 7 are schematic structural diagrams corresponding to forming a conductive layer in a method of preparing a semiconductor structure according to an exemplary embodiment of the present disclosure.

Figure 4:
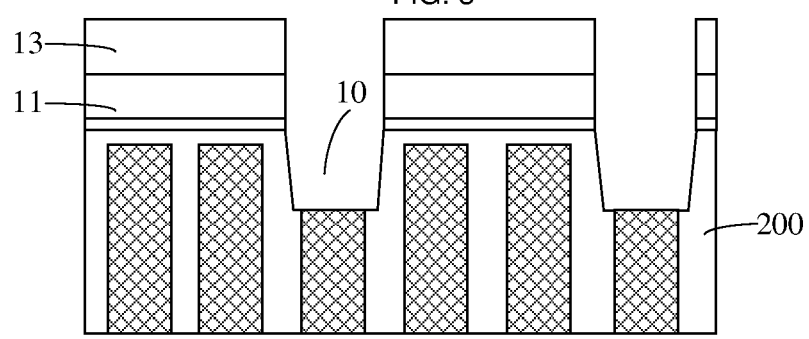
FIG. 4 is a schematic structural diagram corresponding to forming a first initial conductive layer in a method of preparing a semiconductor structure according to an embodiment of the present disclosure.
Figure 7:
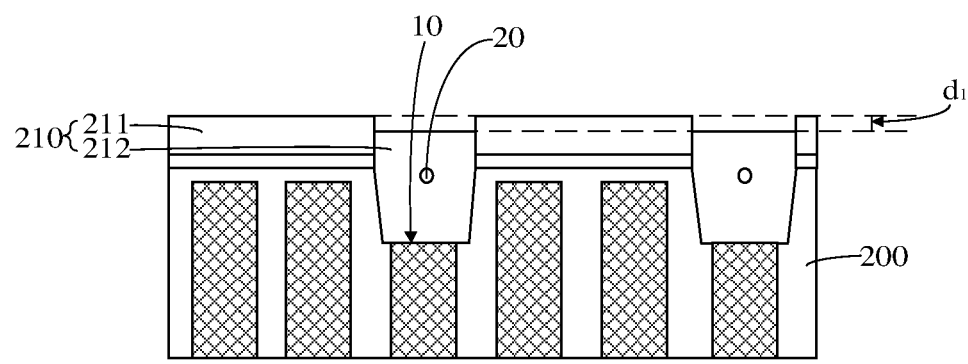
FIG. 7 is a schematic structural diagram corresponding to removing a first sacrificial layer 13 in a method of preparing a semiconductor structure according to an embodiment of the present disclosure.

Referring to FIG. 4 and FIG. 7, provide a substrate 200, the substrate 200 being provided with a recess 10, and a surface of the substrate 200 exposing an opening of the recess 10; and form a conductive layer 210, the conductive layer 210 including a first conductive layer 211 and a second conductive layer 212, the first conductive layer 211 being located on the surface of the substrate 200, the second conductive layer 212 being located in the recess 10, a top surface of the second conductive layer 212 being lower than a top surface of the first conductive layer 211, and the second conductive layer 212 located in the recess 10 being provided with a void 20.

In some embodiments, the substrate 200 is made of a semiconductor material. In some embodiments, the substrate 200 is made of silicon. In other embodiments, the substrate 200 may also be a germanium substrate, a germanium-silicon substrate, a silicon carbide substrate, or a silicon substrate on an insulator.

In some embodiments, a method of forming the recess 10 may include: patterning the substrate 200 for defining a position of the opening of the recess 10; and etching the surface of the patterned substrate 200 to form the recess 10 having a set depth in the substrate 200. Since the recess 10 has a large aspect ratio, when the second conductive layer 212 is subsequently formed in the recess 10, the void 20 may be formed in the second conductive layer 212.

Figure 5:
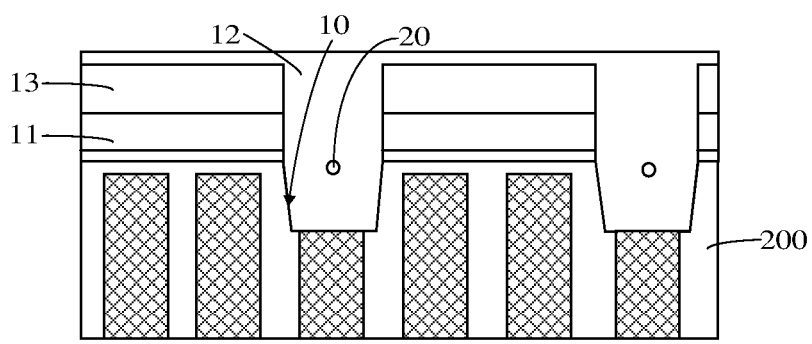
FIG. 5 is a schematic structural diagram corresponding to forming a second initial conductive layer in a method of preparing a semiconductor structure according to an embodiment of the present disclosure.

In some embodiments, a method for forming the top surface of the second conductive layer 212 being lower than the top surface of the first conductive layer 211 includes:
referring to FIG. 4 and FIG. 5, forming a first initial conductive layer 11 and a second initial conductive layer 12, the first initial conductive layer 11 covering the surface of the substrate 200, and the second initial conductive layer 12 filling the recess 10. Specifically, referring to FIG. 4, in some embodiments, the first initial conductive layer 11 may be formed on the surface of the substrate 200 before the recess 10 is formed. The first initial conductive layer 11 may be formed on the surface of the substrate 200 by a deposition process. In some embodiments, a first sacrificial layer 13 may be formed on the top surface of the first initial conductive layer 11 before the recess 10 is formed, to pattern the surface of the first initial conductive layer 11. The patterned surface of the first initial conductive layer 11 is then etched until part of the substrate 200 is exposed, the recess 10 having a set depth is formed in the substrate 200, and the remaining part of the first initial conductive layer 11 may serve as the first conductive layer 211. In some embodiments, the first sacrificial layer 13 may be made of silicon oxide. In other embodiments, the first sacrificial layer 13 may also be made of any one of a carbon material, an SOC material, borosilicate glass, phosphorosilicate glass, or tetraethoxysilane.

Referring to FIG. 5, in some embodiments, the second initial conductive layer 12 may be formed in the recess 10 by a deposition process, and is further located on the top surface of the first sacrificial layer 13. In some embodiments, the deposition process may include any one of: chemical vapor deposition, physical vapor deposition, atomic layer deposition, or metal organic chemical vapor deposition. In some embodiments, the first initial conductive layer 11 and the second initial conductive layer 12 may be made of the same material, such as a polysilicon material.

Figure 6:
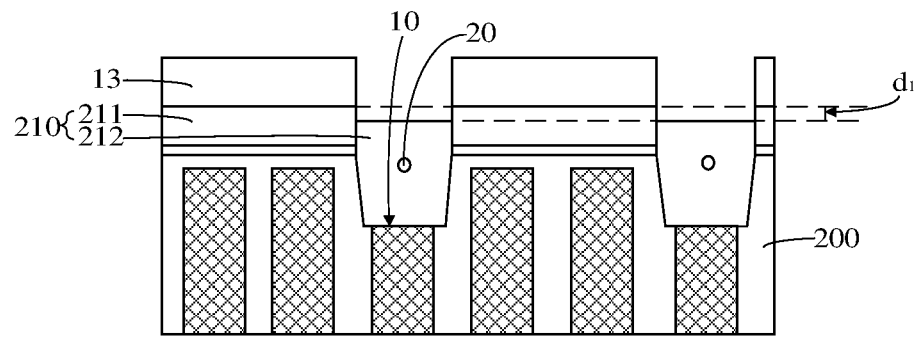
FIG. 6 is a schematic structural diagram corresponding to forming a first conductive layer and a second conductive layer in a method of preparing a semiconductor structure according to an embodiment of the present disclosure.
Figure 8:
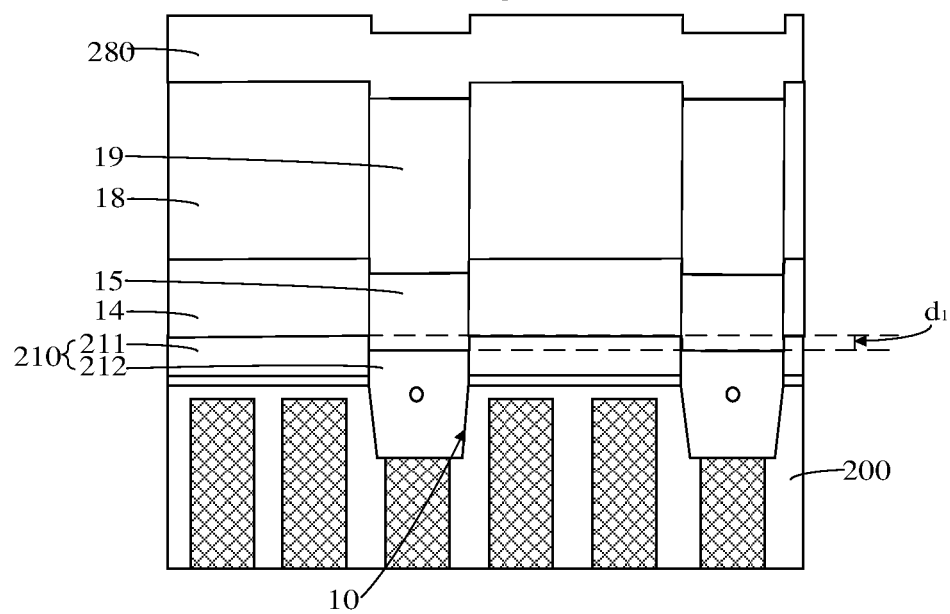
FIG. 8 is a schematic structural diagram corresponding to forming a first initial bit line conductive layer and a second initial bit line conductive layer in a method of preparing a semiconductor structure according to an embodiment of the present disclosure.
Figure 9:
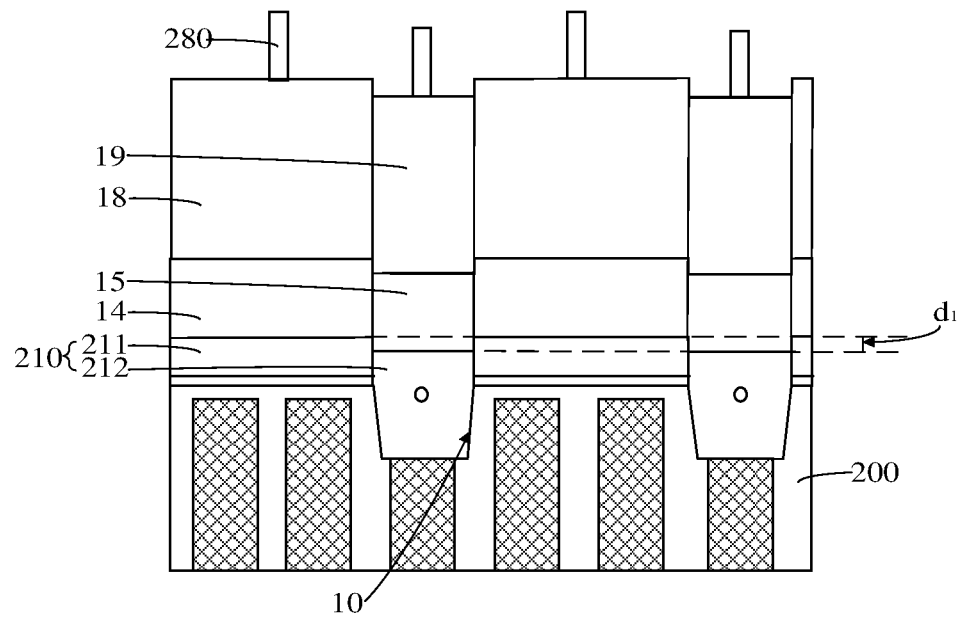
FIG. 9 is a schematic structural diagram corresponding to patterning a second sacrificial layer in a method of preparing a semiconductor structure according to an embodiment of the present disclosure.
Figure 10:
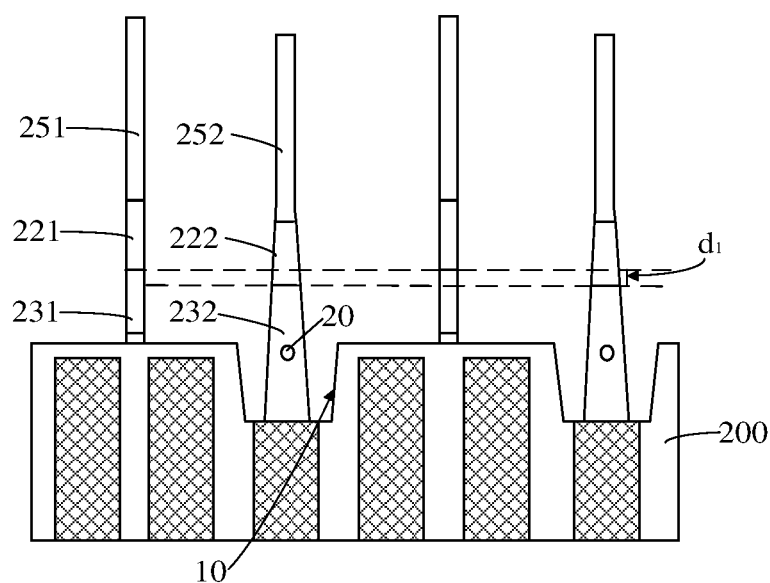
FIG. 10 is a schematic structural diagram corresponding to forming a bit line contact structure in a method of preparing a semiconductor structure according to an embodiment of the present disclosure.

Referring to FIG. 6, an initial etching process is performed on the top surface of the second initial conductive layer 12 to form the second conductive layer 212, and the top surface of the second conductive layer 212 is lower than the top surface of the first conductive layer 211. Specifically, in some embodiments, the initial etching process is an etching-back process. The second initial conductive layer 12 is etched by the etching-back process, to remove a part of the second initial conductive layer 12 higher than the top surface of the first sacrificial layer 13 and a part of the second initial conductive layer 12 in contact with the first conductive layer 211 to form the second conductive layer 212. The top surface of the second conductive layer 212 is lower than the top surface of the first conductive layer 211. In some embodiments, the initial etching process may be a dry etching process. The top surface of the second conductive layer 212 is lower than the top surface of the first conductive layer 211, such that in a subsequent same process step, as shown in FIG. 8, when a first initial bit line conductive layer 14 is formed on the top surface of the first conductive layer 211 and a second initial bit line conductive layer 15 is formed on the top surface of the second conductive layer 212, the top surface of the second initial bit line conductive layer 15 may be lower than the top surface of the first initial bit line conductive layer 14. In this way, the first initial bit line conductive layer 14, the second initial bit line conductive layer 15, the first conductive layer 211, and the second conductive layer 212 are subsequently etched, a height difference between the first initial bit line conductive layer 14 and the second initial bit line conductive layer 15 and a height difference between the first conductive layer 211 and the second conductive layer 212 may be converted into an etching rate difference of performing the etching process on the second initial bit line conductive layer 15, such that second bit line conductive layer 222 formed by the second etching process has a trapezoidal morphology of narrow top and wide bottom. As shown in FIG. 9 and FIG. 10, when the second conductive layer 212 is subsequently etched, the morphology of the second bit line conductive layer 222 is continued, such that the formed bit line contact structure 232 may also have a trapezoidal morphology of narrow top and wide bottom.

In some embodiments, the initial etching process is conducted on the second initial conductive layer 12 for 8 s to 16 s. The etching process is controlled within the range of 8 s to 16 s, such that the etching time is not too long, and the formed second conductive layer 212 is not too low relative to the first conductive layer 211. In this way, the second initial bit line conductive layer 15 formed subsequently is not too low relative to the first initial bit line conductive layer 14 (referring to FIG. 8). That is, the problem that the bottom of the formed second bit line conductive layer 222 is too wide due to too long etching time of the second etching process for the second initial bit line conductive layer 15 can be avoided (referring to FIG. 10). Thus, when the second conductive layer 212 is subsequently etched along the morphology of the second bit line conductive layer 222 to form the bit line contact structure 232, the bottom of the bit line contact structure 232 is not too wide. That is, the problem that the bit line protective layer 260 may not achieve a good isolation effect (referring to FIG. 13) due to too thin bit line protective layer 260 formed in the recess 10 when the bit line protective layer 260 is subsequently formed on both sides of the bit line contact structure 232 caused by a too large volume of the bit line contact structure 232 occupied in the recess 10 can be avoided, such that the problem of electric leakage in the substrate 200 can be avoided. The etching process is controlled within the range of 8 s to 16 s, such that the etching time is not too short. That is, a height difference between the top surface of the second initial bit line conductive layer 15 formed subsequently and the top surface of the first initial bit line conductive layer 14 is not too small, which may avoid the problem that the formed bit line contact structure 232 does not have a trapezoidal morphology of narrow top and wide bottom due to too short etching time of the second etching process for the second initial bit line conductive layer 15.

In some embodiments, as shown in FIG. 6, in the direction perpendicular to the substrate 200, a height difference d1 between the top surface of the second conductive layer 212 and the top surface of the first conductive layer 211 is 8 nm to 16 nm. It should be considered that the volume occupied by the formed bit line contact structure 232 in the recess 10 should not be too large. In other words, a certain space needs to be reserved in the recess 10 for the subsequent formation of the bit line protective layer 260 on both sides of the bit line contact structure 232. This is because if the bit line protective layer 260 is too thin, the substrate 200 may suffer from electric leakage (referring to FIG. 13). On the other hand, it should be considered that in the direction that the top surface of the bit line contact structure 232 points to the bottom surface of the bit line contact structure 232, it is necessary to form such a morphology that the widths of parts of the bit line contact structure 232 gradually increase, such that the side walls of the bit line contact structure 232 directly facing the void 20 are thick, and when the bit line protective layer 260 and the capacitor contact structures 270 are subsequently formed on both sides of the bit line contact structure 232, the problem of short circuit in the semiconductor structure due to electric connection between the capacitor contact structures 270 located on both sides of the bit line contact structure 232 through the penetrated bit line contact structure 232 because the side walls of the bit line contact structure 232 directly facing the void 20 are penetrated due to being too thin is not easy to occur. In consideration of the above two points, setting the height difference d1 between the top surface of the second conductive layer 212 and the top surface of the first conductive layer 211 to be 8 nm to 16 nm may greatly reduce the possibility of short circuit in the semiconductor structure, and may maintain good properties of the semiconductor structure.

It should be noted that in some embodiments, the time of performing the initial etching process on the second initial conductive layer 12 can be adjusted, such that the height difference between the top surface of the second conductive layer 212 and the top surface of the first conductive layer 211 is adjusted. In other embodiments, a height difference to be formed between the top surface of the second conductive layer 212 and the top surface of the first conductive layer 211 can also be determined in advance, and then the time of the initial etching process is determined in combination with the etching rate of the initial etching process. For example, in some embodiments, the rate of the initial etching process is 1 nm/s, then the time of performing the initial etching process on the second initial conductive layer 12 can be controlled to be 8 s to 16 s on the basis that the height difference between the top surface of the second conductive layer 212 and the top surface of the first conductive layer 211 is 8 nm to 16 nm.

Referring to FIG. 7, the first sacrificial layer 13 is removed, such that the first initial bit line conductive layer may be subsequently formed on the top surface of the first conductive layer 211.

Referring to FIG. 8, a first initial bit line conductive layer 14 is formed on a side of the first conductive layer 211 distant from the substrate 200, and a second initial bit line conductive layer 15 is formed on a side of the second conductive layer 212 distant from the substrate 200, a top surface of the first initial bit line conductive layer 14 being higher than a top surface of the second initial bit line conductive layer 15.

In some embodiments, in a same process step, the deposition process may be used to deposit the first initial bit line conductive layer 14 on the side of the first conductive layer 211 distant from the substrate 200 and the second initial bit line conductive layer 15 on the side of the second conductive layer 212 distant from the substrate 200. In some embodiments, the first initial bit line conductive layer 14 and the second initial bit line conductive layer 15 may be made of the same material. That is, the first initial bit line conductive layer 14 and the second initial bit line conductive layer 15 may be formed simultaneously in a same process step. Since the top surface of the second conductive layer 212 is lower than the top surface of the first conductive layer 211, in a same process step, when the first initial bit line conductive layer 14 and the second initial bit line conductive layer 15 are formed on the basis of the first conductive layer 211 and the second conductive layer 212, the formed first initial bit line conductive layer 14 and the formed second initial bit line conductive layer 15 also have morphologies similar to those of the first conductive layer 211 and the second conductive layer 212. That is, the top surface of the first initial bit line conductive layer 14 is also higher than the top surface of the second initial bit line conductive layer 15. In subsequent etching steps, the height difference between the first initial bit line conductive layer 14 and the second initial bit line conductive layer 15 and the height difference between the first conductive layer 211 and the second conductive layer 212 may be converted into an etching rate difference of performing the etching process on the second initial bit line conductive layer 15, as shown in FIG. 10, such that a part of the second bit line conductive layer 222 facing the second conductive layer 212 in the formed second bit line conductive layer 222 has a trapezoidal morphology of narrow top and wide bottom. In this way, when the second conductive layer 212 is subsequently etched, the morphology of a part of the second bit line conductive layer 222 facing the second conductive layer 212 is taken as a mold, and the formed bit line contact structure 232 also has a trapezoidal morphology of narrow top and wide bottom.

In some embodiments, the first initial bit line conductive layer 14 and the second initial bit line conductive layer 15 may be made of a metal material, which may include any one of tungsten, copper, or aluminum.

In some embodiments, a length the first initial bit line conductive layer 14 is smaller than a length of the second initial bit line conductive layer 15 in the direction perpendicular to the substrate 200. Compared with the first initial bit line conductive layer 14 as long as the second initial bit line conductive layer 15, the second initial bit line conductive layer 15 is set to be longer, such that when the second initial bit line conductive layer 15 is subsequently etched by the second etching process, the etching time of the second etching process for the second initial bit line conductive layer 15 is longer, as shown in FIG. 10, and the bottom of the formed second bit line conductive layer 222 is wider. When the second conductive layer 212 is continuously etched along the morphology of the second bit line conductive layer 222 to form the bit line contact structure 232, the overall width of the bit line contact structure 232 is large, and the thicknesses of the side walls of the bit line contact structure 232 directly facing the void 20 can be further increased to further avoid the problem that the side walls of the bit line contact structure 232 directly facing the void 20 are penetrated in the subsequent process.

In some embodiments, the method of forming a length of the first initial bit line conductive layer 14 being smaller than a length of the second initial bit line conductive layer 15 may include: depositing an initial bit line conductive layer on the top surface of the first conductive layer 211 and the top surface of the second conductive layer 212, where a part of the initial bit line conductive layer located on the top surface of the first conductive layer 211 serves as the first initial bit line conductive layer 14; forming a mask layer on the top surface of the first initial bit line conductive layer 14; depositing the same material as the initial bit line conductive layer on the exposed top surface of the initial bit line conductive layer to form the second initial bit line conductive layer 15; and removing the mask layer.

In some embodiments, the preparing method further includes: forming a second sacrificial layer 280 on the side of the first initial bit line conductive layer 14 and the second initial bit line conductive layer 15 distant from the substrate 200, the second sacrificial layer 280 serving as a mask for etching a first initial bit line having a preset shape and a second initial bit line having a preset shape.

Referring to FIG. 9, the second sacrificial layer 280 is patterned.

Referring to FIG. 9 and FIG. 10, the bit line contact structure 232 is formed. The first initial bit line conductive layer 14 is etched by the first etching process until the first conductive layer 211 is exposed to form a first bit line conductive layer 221, the first etching process is performed on a part of the second initial bit line conductive layer 15, and the second initial bit line conductive layer 15 is not completely etched. That is to say, in a same process step, the first initial bit line conductive layer 14 and the second initial bit line conductive layer 15 are etched by the first etching process. The top surface of the first initial bit line conductive layer 14 is higher than the top surface of the second initial bit line conductive layer 15, such that the first initial bit line conductive layer 14 is etched first by the first etching process. When the first initial bit line conductive layer 14 is completely etched by the first etching process, since the second initial bit line conductive layer 15 is etched later, the second initial bit line conductive layer 15 is not completely etched at this moment.

The first conductive layer 211 is etched by the second etching process to form a first conductive structure 231. The width of the first conductive structure 231 remains unchanged in the direction perpendicular to the substrate 200. The remaining part of the second initial bit line conductive layer 15 is etched by the second etching process to form the second bit line conductive layer 222. The etching rate of the first etching process for the second initial bit line conductive layer 15 is greater than the etching rate of the second etching process for the second initial bit line conductive layer 15. The second etching process is an etching process set on the basis of the first conductive layer 211. In some embodiments, the first conductive layer 211 and the first initial bit line conductive layer 14 are made of different materials, such that the etching rate of the second etching process for the first conductive layer 211 is greater than the etching rate of the second etching process for the first initial bit line conductive layer 14. When the remaining part of the second initial bit line conductive layer 15 is etched by the second etching process, the etching selectivity of the second etching process for the second initial bit line conductive layer 15 is small, such that the etching rate of the first etching process for the second initial bit line conductive layer 15 is greater than the etching rate of the second etching process for the second initial bit line conductive layer 15. That is to say, in the direction that the top of the second initial conductive layer 12 points to the bottom of the second initial conductive layer 12, the etching rate for the second initial conductive layer 12 becomes small. In the direction that the top of the second initial conductive layer 12 points to the bottom of the second initial conductive layer 12, the second bit line conductive layer 222 formed by the second etching process may have a morphology of gradually increasing widths.

Figure 13:
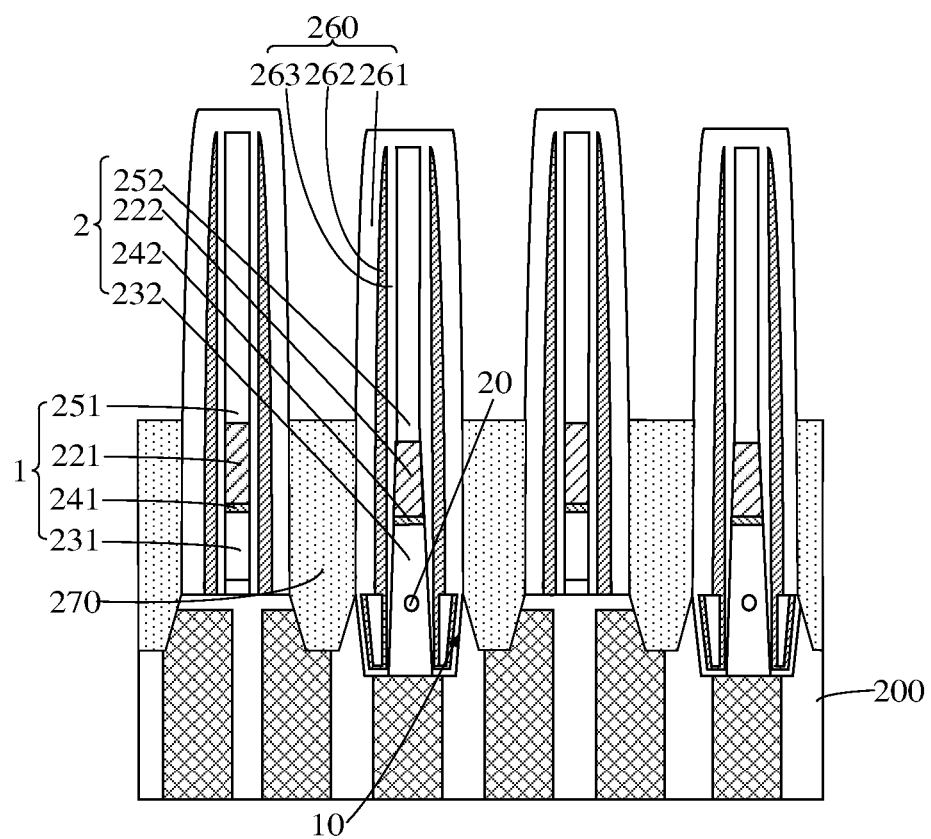
FIG. 13 is a schematic structural diagram corresponding to forming a bit line protective layer and a capacitor contact structure in another method of preparing a semiconductor structure according to an embodiment of the present disclosure.

As shown in FIG. 10, the first etching process is an etching process set on the basis of the first initial bit line conductive layer 14, the second etching process is an etching process set on the basis of the first conductive layer 211, and the etching rate of the first etching process for the first initial bit line conductive layer 14 is equal to the etching rate of the second etching process for the first conductive layer 211, the morphology of unchanged width of the first conductive structure 231 is formed. Compared with the gradually increasing widths of parts of the first conductive structure 231 in the direction that the first bit line conductive layer 221 points to the first conductive structure 231, the width of the first conductive structure 231 is set to be unchanged, such that there is a large space between the first conductive structure 231 and the bit line contact structure 232, as shown in FIG. 13, and a large space is reserved for subsequent formation of the bit line protective layer 260 and the capacitor contact structure 270 between the first conductive structure 231 and the bit line contact structure 232. On the one hand, the bit line protective layer 260 formed subsequently may be thick to better separate the bit line contact structure 232 from the capacitor contact structure 270; and on the other hand, the formed capacitor contact structure 270 has a large volume to facilitate improving the electric properties of the capacitor contact structure 270.

In some embodiments, the first etching process and the second etching process may be a dry etching process. Specifically, in some embodiments, the first etching process may use a first etching gas, which may be, for example, $Cl_2$; and the second etching process may use a second etching gas, which may be, for example, HBr. Since the first etching gas is first in contact with the first initial bit line conductive layer 14 having a higher top surface, the first etching gas first etches the first initial bit line conductive layer 14, such that the first etching gas can first completely etch the first initial bit line conductive layer 14. When the second etching gas etches the first conductive layer 211, the etching selectivity of the second etching gas for the second initial bit line conductive layer 15 is small, such that the etching rate of the first etching gas for the second initial bit line conductive layer 15 is greater than the etching rate of the second etching gas for the second initial bit line conductive layer 15. An etching gas etches the first initial bit line conductive layer 14, the first conductive layer 211, and the second initial bit line conductive layer 15, such that it is easy to implement the step of first completely etching the first initial bit line conductive layer 14 by the first etching process, the step is simple, and large-scale application is facilitated.

Figure 11:
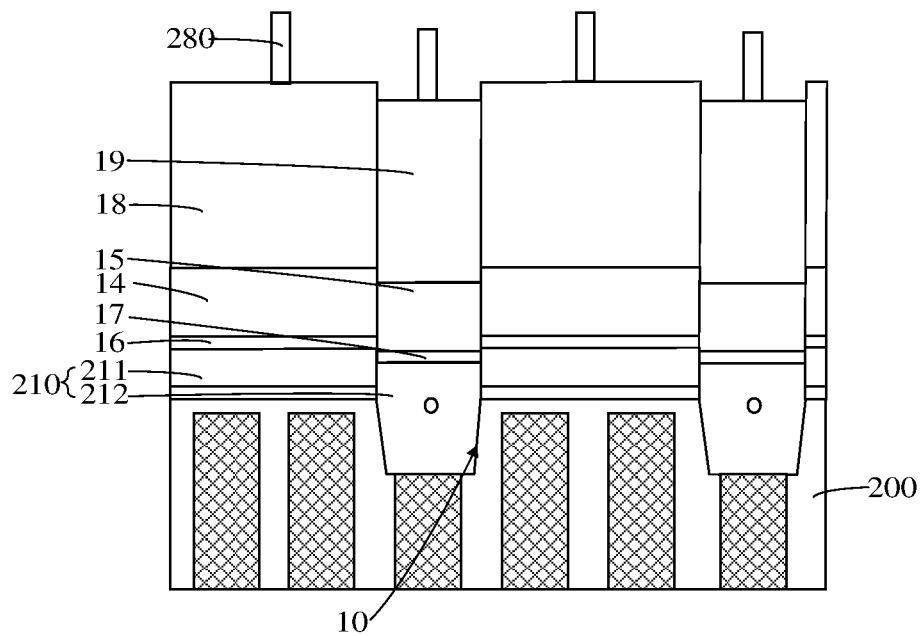
FIG. 11 is a schematic structural diagram corresponding to forming a first initial adhesion layer and a second initial adhesion layer in a method of preparing a semiconductor structure according to an embodiment of the present disclosure.

Referring to FIG. 11, in other embodiments, the preparing method further includes: forming a first initial adhesion layer 16 between the first conductive layer 211 and the first initial bit line conductive layer 14, and forming a second initial adhesion layer 17 between the second conductive layer 212 and the second initial bit line conductive layer 15. The first initial adhesion layer 16 and the second initial adhesion layer 17 may increase the adhesiveness between the first conductive layer 211 and the first initial bit line conductive layer 14 and the adhesiveness between the second conductive layer 212 and the second initial bit line conductive layer 15, thereby facilitating the improvement of the electric connection properties between the first conductive layer 211 and the first initial bit line conductive layer 14 and the electric connection properties between the second conductive layer 212 and the second initial bit line conductive layer 15. In some embodiments, the first initial adhesion layer 16 and the second initial adhesion layer 17 may be made of the same material. The first initial adhesion layer 16 and the second initial adhesion layer 17 may be formed in a same process step. The top surface of the first initial adhesion layer 16 is higher than the top surface of the second initial adhesion layer 17. In some embodiments, the first initial adhesion layer 16 and the second initial adhesion layer 17 may be formed by the deposition process. In some embodiments, the first initial adhesion layer 16 and the second initial adhesion layer 17 may be made of at least one of titanium nitride or titanium.

Figure 12:
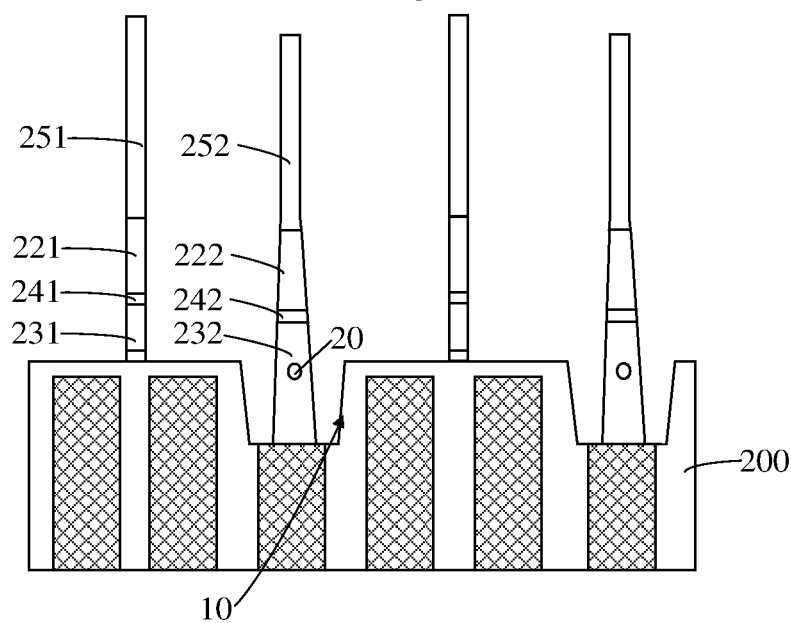
FIG. 12 is a schematic structural diagram corresponding to forming a bit line contact structure in another method of preparing a semiconductor structure according to an embodiment of the present disclosure.

Referring to FIG. 11 and FIG. 12, a first adhesion layer 241 and a second adhesion layer 242 are formed. In some embodiments, after the first initial adhesion layer 16 and the second initial adhesion layer 17 are formed, and before the first conductive layer 211 is etched by the second etching process, the preparing method further includes: etching the first initial adhesion layer 16 by a third etching process; and performing the third etching process on the second initial bit line conductive layer 15, the etching rate of the first etching process for the second initial bit line conductive layer 15 being greater than the etching rate of the third etching process for the second initial bit line conductive layer 15. Since the top surface of the first initial bit line conductive layer 14 is higher than the top surface of the second initial bit line conductive layer 15, after the first initial bit line conductive layer 14 is completely etched by the first etching process, and when the first initial adhesion layer 16 is etched by the third etching process designed on the basis of the first initial adhesion layer 16, the remaining part of the second initial bit line conductive layer 15 is also etched by the third etching process. Since the first initial adhesion layer 16 and the first initial bit line conductive layer 14 are made of different materials, and the etching selectivity of the third etching process for the first initial bit line conductive layer 14 is small, the etching selectivity of the third etching process for the second initial bit line conductive layer 15 is small. That is to say, the etching rate of the third etching process for the second initial bit line conductive layer 15 is smaller than the etching rate of the first etching process for the second initial bit line conductive layer 15, such that in the direction that the second initial bit line conductive layer 15 points to the second conductive layer 212, the widths of parts of the second bit line conductive layer 222 formed by the third etching process gradually increase.

It can be understood that after the first initial adhesion layer 16 is completely etched by the third etching process, the first conductive layer 211 is etched by the second etching process. Since the remaining part of the second initial bit line conductive layer 15 is also etched by the second etching process, in the direction that the second initial bit line conductive layer 15 points to the second conductive layer 212, the widths of parts of the second bit line conductive layer 222 formed by the second etching process also gradually increase. When the second initial adhesion layer 17 is etched subsequently, the morphology of the second bit line conductive layer 222 is continued by the formed second adhesion layer 242. That is, the widths of parts of the second adhesion layer 242 gradually increase in the direction that the second adhesion layer 242 points to the second conductive layer 212. When the second conductive layer 212 is subsequently etched to form the bit line contact structure 232, the morphology of the second adhesion layer 242 may also be taken as a mold to form a morphology that the widths of parts of the bit line contact structure 232 gradually increase in the direction that the top surface of the bit line contact structure 232 points to the bottom surface of the bit line contact structure 232.

Still referring to FIG. 9 and FIG. 11, in some embodiments, the preparing method further includes: forming a first initial insulating layer 18 on the top surface of the first initial bit line conductive layer 14, and forming a second initial insulating layer 19 on the top surface of the second initial bit line conductive layer 15. In some embodiments, the first initial insulating layer 18 and the second initial insulating layer 19 may be made of the same material. The first initial insulating layer 18 and the second initial insulating layer 19 may be formed in a same process step. The top surface of the first initial bit line conductive layer 14 is higher than the top surface of the second initial bit line conductive layer 15, such that when the first initial insulating layer 18 and the second initial insulating layer 19 are formed in a same process step, the top surface of the first initial insulating layer 18 is higher than the top surface of the second initial insulating layer 19. In some embodiments, the first initial insulating layer 18 and the second initial insulating layer 19 may be made of any one of silicon oxide or silicon nitride.

Referring to FIG. 10 and FIG. 12, a first insulating layer 251 and a second insulating layer 252 are formed.

In some embodiments, the first initial insulating layer 18 may be etched by a fourth etching process until the first initial bit line conductive layer 14 is exposed to form the first insulating layer 251, the fourth etching process is performed on a part of the second initial insulating layer 19, and the second initial insulating layer 19 is not completely etched. The top surface of the first initial insulating layer 18 is higher than the top surface of the second initial insulating layer 19, such that when the first initial insulating layer 18 and the second initial insulating layer 19 are etched by the fourth etching process in a same process step, the first initial insulating layer 18 is etched first by the fourth etching process, and the second initial insulating layer 19 is not completely etched when the first initial insulating layer 18 is completely etched by the fourth etching process.

When the first initial insulating layer 18 is completely etched, the first initial bit line conductive layer 14 is etched by the first etching process, and the remaining part of the second initial insulating layer 19 is etched by the first etching process to form the second insulating layer 252. The etching rate of the fourth etching process for the second initial insulating layer 19 is greater than the etching rate of the first etching process for the second initial insulating layer 19. The first etching process is an etching process designed on the basis of the first initial bit line conductive layer 14, and the first initial bit line conductive layer 14 and the first initial insulating layer 18 are made of different materials, such that the etching selectivity of the first etching process for the second initial insulating layer 19 is small. In the direction that the second insulating layer 252 points to the second bit line conductive layer 222, the widths of parts of the second insulating layer 252 formed by the first etching process gradually increase. The second bit line conductive layer 222, the second adhesion layer 242 and the bit line contact structure 232 formed subsequently have a morphology of gradually increasing widths in the direction that the second insulating layer 252 points to the second bit line conductive layer 222.

Referring to FIG. 10 and FIG. 12, the second conductive layer 212 is etched to form the bit line contact structure 232 wrapping the void 20. The widths of parts of the bit line contact structure 232 gradually increase in the direction that the top surface of the bit line contact structure 232 points to the bottom surface of the bit line contact structure 232. In some embodiments, after the second initial bit line conductive layer 15 is completely etched by the second etching process, the second conductive layer 212 may be continuously etched by the second etching process. Since the widths of parts of the second bit line conductive layer 222 formed by the second etching process gradually increase in the direction that the second initial bit line conductive layer 15 points to the second conductive layer 212, when the second conductive layer 212 is etched by the second etching process to form the bit line contact structure 232, the morphology of the second bit line conductive layer 222 in contact with the second conductive layer 212 may be continued, such that the bit line contact structure 232 also has a morphology of gradually increasing widths in the direction that the top surface of the bit line contact structure 232 points to the bottom surface of the bit line contact structure 232. That is to say, the widths of parts of the bit line contact structure 232 gradually increase in the direction that the top surface of the bit line contact structure 232 points to the void 20, such that the bit line contact structure 232 directly facing the void 20 is wide. As shown in FIG. 13, after the capacitor contact structures 270 are subsequently formed on both sides of the bit line contact structure 232, the side walls of the bit line contact structure 232 corresponding to the void 20 are not penetrated, thereby reducing the possibility of short circuit in the semiconductor structure.

Referring to FIG. 13, in some embodiments, the first conductive structure 231 and the first bit line conductive layer 221 constitute a first bit line 1, and the bit line contact structure 232 and the second bit line conductive layer 222 constitute a second bit line 2. The preparing method further includes: forming the bit line protective layer 260 on the side wall of the first bit line 1 and the side wall of the second bit line 2. The bit line protective layer 260 is configured to protect the first bit line 1 and the second bit line 2, and is also configured to separate the capacitor contact structure 270 from the bit line contact structure 232 when the capacitor contact structure 270 is subsequently formed between the first bit line 1 and the second bit line 2, thereby avoiding the phenomenon of short circuit in the semiconductor structure due to electric connection between the capacitor contact structure 270 and the bit line contact structure 232. In some embodiments, the bit line protective layer 260 may be of a multilayer structure, which may include, for example, a first bit line protective layer 261, a second bit line protective layer 262, and a third bit line protective layer 263 arranged in sequence. The first bit line protective layer 261 and the third bit line protective layer 263 may be made of the same material, which may be, for example, silicon nitride. The second bit line protective layer 262 may be made of silicon oxide. The bit line protective layer 260 is set to be a multilayer structure, and thereof has a higher hardness to better protect a bit line. In some embodiments, the bit line protective layer 260 may be formed on the side surface of the first bit line 1 and the side surface of the second bit line 2 by the deposition process. The deposition process may be any one of: chemical vapor deposition, physical vapor deposition, atomic layer deposition, or metal organic chemical vapor deposition.

In some embodiments, when the first adhesion layer 241 is formed between the first conductive structure 231 and the first bit line conductive layer 221, the second adhesion layer 242 is formed between the bit line contact structure 232 and the second bit line conductive layer 222, the first insulating layer 251 is formed on the top surface of the first bit line conductive layer 221, and the second insulating layer 252 is formed on the top surface of the second bit line conductive layer 222, the bit line protective layer 260 is also located on the side surface of the first adhesion layer 241, the side surface of the second adhesion layer 242, the side surface of the first insulating layer 251, and the side surface of the second insulating layer 252.

Still referring to FIG. 13, in some embodiments, after the bit line protective layer 260 is formed on the side surface of the first bit line 1 and the side surface of the second bit line 2, the preparing method further includes: forming the capacitor contact structure 270 between the adjacent parts of the bit line protective layer 260. In some embodiments, the formed capacitor contact structure 270 is also located in part of the substrate 200. The capacitor contact structure 270 is configured to lead out an electric signal of a source/drain in the substrate 200, and is electrically connected to a capacitor structure (not shown in the figure). In some embodiments, the method of forming the capacitor contact structure 270 may include: patterning the substrate 200 between the adjacent parts of the bit line protective layer 260, where in some embodiments, the adjacent parts of the bit line protective layer 260 may be taken as a mask to pattern the substrate 200, thereby simplifying the process flow; etching the patterned surface of the substrate 200 to form a groove having a set depth in the substrate 200; and forming the capacitor contact structure 270 in the groove by the deposition process, and forming the capacitor contact structure 270 between the adjacent parts of the bit line protective layer 260. In some embodiments, the capacitor contact structure 270 may be made of polysilicon.

In the technical solutions of the method of preparing a semiconductor structure provided in the embodiments of the present disclosure, the top surface of the first initial bit line conductive layer 14 is set to be higher than the top surface of the second initial bit line conductive layer 15, and the top surface of the first conductive layer 211 is set to be higher than the top surface of the second conductive layer 212. During subsequent etching, the height difference between the first initial bit line conductive layer 14 and the second initial bit line conductive layer 15 and the height difference between the first conductive layer 211 and the second conductive layer 212 are converted into an etching rate difference of the first etching process and the second etching process for the second initial bit line conductive layer 15. In the direction that the second bit line conductive layer 222 points to the second conductive layer 212, parts of the second bit line conductive layer 222 facing the second conductive layer 212 may form a morphology of gradually increasing widths, such that when the second conductive layer 212 is subsequently etched to form the bit line contact structure 232, the morphology of the second conductive layer 212 is also continued by the bit line contact structure 232, and the width of the bit line contact structure 232 directly facing the void 20 is large. In this way, after the capacitor contact structures 270 are formed on both sides of the bit line contact structure 232, it is not easy to penetrate the side walls of the bit line contact structure 232 corresponding to the void 20, thereby improving the phenomenon of short circuit in the semiconductor structure.

The embodiments of the present disclosure further provide a semiconductor structure. The semiconductor structure may be prepared by the method of preparing a semiconductor structure provided in the above embodiment. The semiconductor structure provided in an embodiment of the present disclosure will be described below in detail with reference to the accompanying drawings.

Referring to FIG. 13, the semiconductor structure includes: a substrate 200 provided with a recess 10, a surface of the substrate 200 exposing an opening of the recess 10; a bit line contact structure 232 located in the recess 10 and wrapping a void 20, widths of parts of the bit line contact structure 232 gradually increasing in a direction that a top surface of the bit line contact structure 232 points to a bottom surface of the bit line contact structure 232; a first conductive structure 231 located on the surface of the substrate 200, a width of the first conductive structure 231 remaining unchanged in a direction perpendicular to the substrate 200; and a first bit line conductive layer 221 and a second bit line conductive layer 222, the first bit line conductive layer 221 being located on a side of the first conductive structure 231 distant from the substrate 200, the second bit line conductive layer 222 being located on a side of the bit line contact structure 232 distant from the substrate 200, a top surface of the first bit line conductive layer 221 being higher than a top surface of the second bit line conductive layer 222.

The widths of parts of the bit line contact structure 232 are set to gradually increase in the direction that the top surface of the bit line contact structure 232 points to the bottom surface of the bit line contact structure 232. That is to say, the widths of parts of the bit line contact structure 232 gradually increase in the direction that the top surface of the bit line contact structure 232 points to the void 20, such that the bit line contact structure 232 directly facing the void 20 is wide. During the actual process, after the capacitor contact structures 270 are formed on both sides of the bit line contact structure 232, the side walls of the bit line contact structure 232 corresponding to the void 20 are not penetrated, thereby avoiding the problem of electric connection between the formed capacitor contact structures 270 and the bit line contact structure 232 through the penetrated bit line contact structure 232, and reducing the possibility of short circuit in the semiconductor structure.

In some embodiments, the width of the top of the bit line contact structure 232 is 5 nm to 10 nm. A part of the bit line contact structure 232 is located in the recess 10, and is connected to the source/drain in the substrate 200 for leading out a signal of the source/drain; and the bit line protective layer 260 is further provided on the side walls of the part of the bit line contact structure 232 located in the recess 10 for isolating the bit line contact structure 232 from other conductive structures in the substrate 200. If the bit line protective layer 260 is too thin, such that the bit line protective layer 260 may not achieve a good isolation effect, the phenomenon of electric leakage may occur in the substrate 200. Therefore, it is necessary to reserve a certain space for the formation of the bit line protective layer 260 in the recess 10. When the width of the top of the bit line contact structure 232 is 5 nm to 10 nm, the bit line contact structure 232 is not too wide, such that the bit line protective layer 260 in the recess 10 is thick. On the other hand, the widths of the bit line contact structure 232 are not too small within this range, such that the problem that the effect of wrapping the void 20 is not achieved due to too small widths of the bit line contact structure 232 may be avoided.

In some embodiments, the width of the bottom of the bit line contact structure 232 is 10 nm to 15 nm. Within this range, on the one hand, the bottom of the bit line contact structure 232 is wide, such that the amplitude of gradually increasing the widths of parts of the bit line contact structure 232 is large in the direction that the top surface of the bit line contact structure 232 points to the bottom surface of the bit line contact structure 232, and the bit line contact structure 232 directly facing the void 20 is wide to better wrap the void 20. That is, the side walls of the bit line contact structure 232 directly facing the void 20 are wide. During the actual process, after the capacitor contact structures 270 are formed on both sides of the bit line contact structure 232, the problem that the side walls of the bit line contact structure 232 corresponding to the void 20 are penetrated in the actual process due to too thin side walls of the bit line contact structure 232 directly facing the void 20 is not easy to occur, thereby improving the problem of short circuit in the semiconductor structure. On the other hand, within this range, the width of the bottom of the bit line contact structure 232 is not too large, such that the bit line protective layer 260 in the recess 10 may be thick.

In some embodiments, the bit line contact structure 232 has opposite side walls and a bottom wall connected to the side walls, there is a first included angle between the side wall of the bit line contact structure 232 and the bottom wall of the bit line contact structure 232, and the first included angle is 60° to 80°. The size of the first included angle is related to the width of the top surface and the width of the bottom surface of the bit line contact structure 232. Within this range, the width of the top surface of the bit line contact structure 232 is not too small, such that the width of the top surface of the bit line contact structure 232 is not too small with respect to the width of the bottom surface of the bit line contact structure 232. In other words, in the direction that the top surface of the bit line contact structure 232 points to the bottom surface of the bit line contact structure 232, the amplitude of gradually increasing the widths of parts of the bit line contact structure 232 is not too large. On the one hand, the width of the bottom of the bit line contact structure 232 is not too large, such that the bit line protective layer 260 in the recess 10 is thick; and on the other hand, the problem that the bit line contact structure 232 cannot better wrap the void 20 due to the fact that the bit line contact structure 232 directly facing the void 20 is just located at a narrow position can be avoided.

In some embodiments, the widths of parts of the second bit line conductive layer 222 gradually increase in the direction that the top of the second bit line conductive layer 222 points to the bottom of the second bit line conductive layer 222. In the process of actually preparing the bit line contact structure 232, the second bit line conductive layer 222 located on the top surface of the bit line contact structure 232 needs to be etched first. The widths of parts of the second bit line conductive layer 222 gradually increase in the direction that the top of the second bit line conductive layer 222 points to the bottom of the second bit line conductive layer 222, such that in the actual preparation process, the morphology of the second bit line conductive layer 222 may be continued by the formed bit line contact structure 232. That is, a morphology that the widths of parts of the bit line contact structures 232 gradually increase is also formed in the direction that the top surface of the bit line contact structure 232 points to the bottom surface of the bit line contact structure 232.

In some embodiments, the width of the first bit line conductive layer 221 remain unchanged in the direction that the top of the first bit line conductive layer 221 points to the bottom of the first bit line conductive layer 221. Compared with the gradually increasing widths of parts of the first conductive structure 231 in the direction that the first bit line conductive layer 221 points to the first conductive structure 231, the width of the first conductive structure 231 is set to be unchanged, such that there is a large space between the first conductive structure 231 and the bit line contact structure 232, and the large space is reserved for subsequent formation of the bit line protective layer 260 and the capacitor contact structure 270 between the first conductive structure 231 and the bit line contact structure 232. On the one hand, the bit line protective layer 260 formed subsequently may be thick to better separate the bit line contact structure 232 from the capacitor contact structure 270; and on the other hand, the formed capacitor contact structure 270 has a large volume to facilitate improving the electric properties of the capacitor contact structure 270.

In some embodiments, the semiconductor structure further includes: a first adhesion layer 241 and a first insulating layer 251, the first adhesion layer 241 being located between the first conductive structure 231 and the first bit line conductive layer 221, and the first insulating layer 251 being located on the top surface of the first bit line conductive layer 221; and a second adhesion layer 242 and a second insulating layer 252, the second adhesion layer 242 being located between the bit line contact structure 232 and the second bit line conductive layer 222, the second insulating layer 252 being located on the top surface of the second bit line conductive layer 222, and widths of parts of the second adhesion layer 242 gradually increasing in a direction that a top of the second adhesion layer 242 points to a bottom of the second adhesion layer 242. The first adhesion layer 241 and the second adhesion layer 242 may increase the adhesiveness between the first conductive structure 231 and the first bit line conductive layer 221 and the adhesiveness between the bit line contact structure 232 and the second bit line conductive layer 222, thereby facilitating the improvement of the electric connection properties between the first conductive structure 231 and the first bit line conductive layer 221 and the electric connection properties between the bit line contact structure 232 and the second bit line conductive layer 222. During the actual preparation process, before the bit line contact structure 232 is formed, it is necessary to etch the second adhesion layer 242 first. When the morphology of the second adhesion layer 242 is that the widths of parts of the second adhesion layer 242 gradually increase in the direction that the top of the second adhesion layer 242 points to the bottom of the second adhesion layer 242, the morphology of the second adhesion layer 242 is continued by the formed bit line contact structure 232, such that the process of preparing the bit line contact structure 232 is simple.

The first insulating layer 251 and the second insulating layer 252 are configured to, on the one hand, protect the first bit line conductive layer 221 and the second bit line conductive layer 222, and on the other hand, separate the first bit line conductive layer 221 and the second bit line conductive layer 222 from other conductive structures.

In some embodiments, the first conductive structure 231 and the first bit line conductive layer 221 constitute the first bit line 1, and the bit line contact structure 232 and the second bit line conductive layer 222 constitute the second bit line 2. It can be understood that in other embodiments, when the semiconductor structure further includes the first adhesion layer 241, the first insulating layer 251, the second adhesion layer 242, and the second insulating layer 252, the first adhesion layer 241 and the first insulating layer 251 may also serve as a part of the first bit line 1, and the second adhesion layer 242 and the second insulating layer 252 may also serve as parts of the second bit line 2.

In some embodiments, the semiconductor structure further includes: a bit line protective layer 260, the bit line protective layer 260 being located on a side wall of the first bit line 1 and a side wall of the second bit line 2, and a part of the bit line protective layer 260 being further located in the recess 10. The bit line protective layer 260 is configured to protect the first bit line 1 and the second bit line 2, and is also configured to separate the capacitor contact structure 270 from the bit line contact structure 232 when the capacitor contact structure 270 is subsequently formed between the first bit line 1 and the second bit line 2, thereby avoiding the phenomenon of short circuit in the semiconductor structure due to electric connection between the capacitor contact structure 270 and the bit line contact structure 232. The part of the bit line protective layer 260 is located in the recess 10 for isolating the bit line contact structure 232 from other conductive structures in the substrate 200, thereby avoiding the problem of electric leakage in the substrate 200. In some embodiments, the bit line protective layer 260 may be of a multilayer structure, which may include, for example, a first bit line protective layer 261, a second bit line protective layer 262, and a third bit line protective layer 263 arranged in sequence. The first bit line protective layer 261 and the third bit line protective layer 263 may be made of the same material, which may be, for example, silicon nitride. The second bit line protective layer 262 may be made of silicon oxide.

In some embodiments, the semiconductor structure further includes: a capacitor contact structure 270, the capacitor contact structure 270 being located between the adjacent parts of the bit line protective layer 260. In some embodiments, the capacitor contact structure 270 is also located in part of the substrate 200. The capacitor contact structure 270 is configured to lead out an electric signal of a source/drain in the substrate 200, and is electrically connected to a capacitor structure (not shown in the figure). The widths of parts of the bit line contact structure 232 gradually increase in the direction that the top surface of the bit line contact structure 232 points to the bottom surface of the bit line contact structure 232, that is, the widths of parts of the bit line contact structure 232 gradually increase in the direction that the void 20 points to the bottom surface of the bit line contact structure 232, such that the bit line contact structure 232 directly facing the void 20 is wide to better wrap the void 20. In the process of actually preparing the capacitor contact structure 270, it is not easy to penetrate the side walls of the bit line contact structure 232 corresponding to the void 20, thereby avoiding the problem of electric connection between the formed capacitor contact structure 270 and the bit line contact structure 232 through the penetrated bit line contact structure 232, and reducing the probability of short circuit in the semiconductor structure.

In the semiconductor structure provided in the above embodiment, the widths of parts of the bit line contact structure 232 are set to gradually increase in the direction that the top surface of the bit line contact structure 232 points to the bottom surface of the bit line contact structure 232, such that the bit line contact structure 232 directly facing the void 20 is wide, and can better wrap the void 20. During the actual process, after the capacitor contact structures 270 are formed on both sides of the bit line contact structure 232, it is not easy to penetrate the side walls of the bit line contact structure 232 corresponding to the void 20, thereby avoiding the problem of electric connection between the formed capacitor contact structures 270 and the bit line contact structure 232 through the penetrated bit line contact structure 232, and reducing the possibility of short circuit in the semiconductor structure.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the technical solutions of the method of preparing a semiconductor structure provided in the embodiments of the present disclosure, the height difference between the first initial bit line conductive layer and the second initial bit line conductive layer and the height difference between the first conductive layer and the second conductive layer are converted into an etching rate difference of performing the etching process on the second initial bit line conductive layer, and a part of the second bit line conductive layer facing the second conductive layer may form a morphology of gradually increasing widths in the direction that the second bit line conductive layer points to the second conductive layer, such that the morphology of the second bit line conductive layer is continued when the second conductive layer is etched subsequently. After the bit line contact structure is formed, the side walls of the bit line contact structure directly facing the void is thick, such that after the capacitor contact structures are formed on both sides of the bit line contact structure, the side walls of the bit line contact structure corresponding to the void cannot be penetrated, thereby reducing the possibility of short circuit in the semiconductor structure.

The invention claimed is:
1. A semiconductor structure, comprising:
a substrate, provided with a recess, a surface of the substrate exposing an opening of the recess;
a bit line contact structure, located in the recess and wrapping a void, widths of parts of the bit line contact structure gradually increasing in a direction that a top surface of the bit line contact structure points to a bottom surface of the bit line contact structure;
a first conductive structure, located on the surface of the substrate, a width of the first conductive structure remaining unchanged in a direction perpendicular to the substrate; and a first bit line conductive layer and a second bit line conductive layer, the first bit line conductive layer being located on a side of the first conductive structure distant from the substrate, the second bit line conductive layer being located on a side of the bit line contact structure distant from the substrate, a top surface of the first bit line conductive layer being higher than a top surface of the second bit line conductive layer.

2. The semiconductor structure according to claim 1, wherein a width of a top of the bit line contact structure is 5 nm to 10 nm.

3. The semiconductor structure according to claim 2, wherein a width of a bottom of the bit line contact structure is 10 nm to 15 nm.

4. The semiconductor structure according to claim 1, wherein a width of a bottom of the bit line contact structure is 10 nm to 15 nm.

5. The semiconductor structure according to claim 1, wherein the bit line contact structure comprises opposite side walls and a bottom wall connected to the side walls, there is a first included angle between the side wall of the bit line contact structure and the bottom wall of the bit line contact structure, and the first included angle is 60° to 80°.

6. The semiconductor structure according to claim 1, wherein widths of parts of the second bit line conductive layer gradually increase in a direction that a top of the second bit line conductive layer points to a bottom of the second bit line conductive layer.

7. The semiconductor structure according to claim 6, wherein a width of the first bit line conductive layer remains unchanged in a direction that a top of the first bit line conductive layer points to a bottom of the first bit line conductive layer.

8. The semiconductor structure according to claim 1, further comprising:

a first adhesion layer and a first insulating layer, the first adhesion layer being located between the first conductive structure and the first bit line conductive layer, and the first insulating layer being located on the top surface of the first bit line conductive layer; and a second adhesion layer and a second insulating layer, the second adhesion layer being located between the bit line contact structure and the second bit line conductive layer, the second insulating layer being located on the top surface of the second bit line conductive layer, and widths of parts of the second adhesion layer gradually increasing in a direction that a top of the second adhesion layer points to a bottom of the second adhesion layer.

9. The semiconductor structure according to claim 1, wherein the first conductive structure and the first bit line conductive layer constitute a first bit line, and the bit line contact structure and the second bit line conductive layer constitute a second bit line.

10. The semiconductor structure according to claim 9, further comprising: a bit line protective layer, located on a side wall of the first bit line and a side wall of the second bit line, and a part of the bit line protective layer being further located in the recess.

11. The semiconductor structure according to claim 10, further comprising: a capacitor contact structure, located between adjacent parts of the bit line protective layer.

* * * * *